(12) United States Patent
Shannon et al.

(10) Patent No.: US 7,777,599 B2
(45) Date of Patent: Aug. 17, 2010

(54) METHODS AND APPARATUS FOR CONTROLLING CHARACTERISTICS OF A PLASMA

(75) Inventors: Steven C. Shannon, San Mateo, CA (US); Daniel J. Hoffman, Saratoga, CA (US); Matthew L. Miller, Fremont, CA (US); Olga Regelman, Daly City, CA (US); Kenneth S. Collins, San Jose, CA (US); Kartik Ramaswamy, San Jose, CA (US); Kallol Bera, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 343 days.

(21) Appl. No.: 11/934,197

(22) Filed: Nov. 2, 2007

(65) Prior Publication Data
US 2009/0140828 A1 Jun. 4, 2009

(51) Int. Cl.
*H01P 7/06* (2006.01)
*H05B 31/26* (2006.01)

(52) U.S. Cl. .................. 333/227; 333/230; 333/231; 315/111.21

(58) Field of Classification Search ........... 315/111.21; 118/723 R, 723 E, 723 I; 156/345.43, 345.44; 333/222, 223, 227, 230, 231, 235, 99 PL
See application file for complete search history.

(56) References Cited

U.S. PATENT DOCUMENTS

| | | | | |
|---|---|---|---|---|
| 5,707,486 A | * | 1/1998 | Collins | 156/345.49 |
| 6,199,505 B1 | * | 3/2001 | Sato et al. | 118/723 E |
| 6,270,618 B1 | * | 8/2001 | Nakano et al. | 118/723 E |
| 6,774,570 B2 | * | 8/2004 | Tsuchiya et al. | 315/111.21 |
| 6,894,245 B2 | * | 5/2005 | Hoffman et al. | 219/121.43 |
| 6,894,589 B2 | * | 5/2005 | Murakami et al. | 333/219 |
| 7,030,335 B2 | | 4/2006 | Hoffman et al. | |
| 7,132,618 B2 | * | 11/2006 | Hoffman et al. | 219/121.43 |
| 7,186,943 B2 | * | 3/2007 | Hoffman et al. | 219/121.36 |
| 7,220,937 B2 | * | 5/2007 | Hofman et al. | 219/121.55 |
| 2004/0168770 A1 | | 9/2004 | Mitrovic et al. | |
| 2006/0021580 A1 | | 2/2006 | Hirano | |
| 2008/0179011 A1 | * | 7/2008 | Collins et al. | 156/345.44 |

FOREIGN PATENT DOCUMENTS

WO 0213225 A3 2/2002

OTHER PUBLICATIONS

Chabert, P. et al., "Inductive heating and E to H transitions in high frequency capacitive discharges," Plasma Sources Sci. Technol. 15 (2006) S130-S136.

* cited by examiner

*Primary Examiner*—Thuy Vinh Tran
(74) *Attorney, Agent, or Firm*—Moser IP Law Group

(57) ABSTRACT

Methods and apparatus for controlling characteristics of a plasma, such as the spatial distribution of RF power and plasma uniformity, are provided herein. In some embodiments, an apparatus for controlling characteristics of a plasma includes a resonator for use in conjunction with a plasma reactor, the resonator including a source resonator for receiving an RF signal having a first frequency; a return path resonator disposed substantially coaxially with, and at least partially within, the source resonator; and an outer conductor having the source resonator and the return path resonator disposed substantially coaxially with, and at least partially within, the outer conductor, the outer conductor for providing an RF ground connection.

33 Claims, 7 Drawing Sheets

METHODS AND APPARATUS FOR CONTROLLING CHARACTERISTICS OF A PLASMA

BACKGROUND

1. Field

Embodiments of the present invention generally relate to apparatus, systems, and methods for forming plasma and, more specifically, to apparatus, systems, and methods for generating and distributing RF waves within a plasma reactor.

2. Description of Related Art

RF plasma reactors are commonly used in the production of microelectronic circuits. Plasma reactors generally form and maintain a plasma within a process chamber from a process gas or process gas mixture supplied to the chamber. The RF source power utilized to form the plasma typically may be coupled either inductively or capacitively into the chamber. In cases in which capacitive coupling is used to apply RF source power, for example, an RF source power generator may be coupled to an overhead electrode (facing a substrate disposed on a substrate support) to supply sufficient RF power at a frequency selected to cause the plasma to be formed. In order to maintain a plasma in the chamber, the overhead electrode continues to transmit RF power into the plasma via the overhead electrode. However, conventional RF plasma reactors often develop a non-uniform spatial distribution of the RF power (e.g., the laterally or radially arranged profile showing where the RF power peaks and valleys fall) within the plasma One problem that can arise in such reactors is due to the unacceptably high degree of variation in the RF power distribution within the plasma and/or with respect to the top surface of the substrate being processed is an unacceptable variation in characteristics in the substrate being processed within the reactor. For example, in an etch process, non-uniformities in the etch rate, critical dimension (CD), sidewall profiles, or other feature characteristics may be undesirably high. In deposition processes, the film thickness, composition, and other characteristics may also be undesirably non-uniform. To the extent features being formed on substrates become finer and more intricate, such non-uniformities may increase, in prevalence, severity, or both. By contrast, greater control of and/or more even distribution of RF power within the plasma and/or with respect to the top surface of the substrate being processed may advantageously improve processing results, thereby contributing to process robustness and predictability. Thus, plasma generation and maintenance processes, apparatus and systems associated with good control over RF power distribution are highly desirable.

Thus, there is a need for improved plasma generation and maintenance processes, apparatus, and systems.

SUMMARY

Methods and apparatus for controlling characteristics of a plasma, such as the spatial distribution of RF power and plasma uniformity, are provided herein. In some embodiments, an apparatus for controlling characteristics of a plasma includes a resonator for use in conjunction with a plasma reactor, the resonator including a source resonator for receiving an RF signal having a first frequency; a return path resonator disposed substantially coaxially with, and at least partially within, the source resonator; and an outer conductor having the source resonator and the return path resonator disposed substantially coaxially with, and at least partially within, the outer conductor, the outer conductor for providing an RF ground connection.

In some embodiments, an apparatus for controlling characteristics of a plasma formed in a plasma reactor includes a plasma processing chamber having an electrode disposed therein; an RF generator; and an adjustable tuning circuit coupling the RF generator to the electrode, the adjustable tuning circuit including a source resonator coupled between the electrode and the RF generator and dimensioned to resonate at a frequency at or near a drive frequency provided by the RF generator; a return path resonator coupled to the electrode in a radially spaced-apart relation with respect to the source resonator; and an outer conductor coupled an RF ground.

In another aspect of the invention, methods for controlling characteristics of a plasma are provided. In some embodiments, a method of controlling characteristics of a plasma includes coupling an RF signal to the plasma through a first resonator; and providing a non-ground RF return path through a second resonator.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
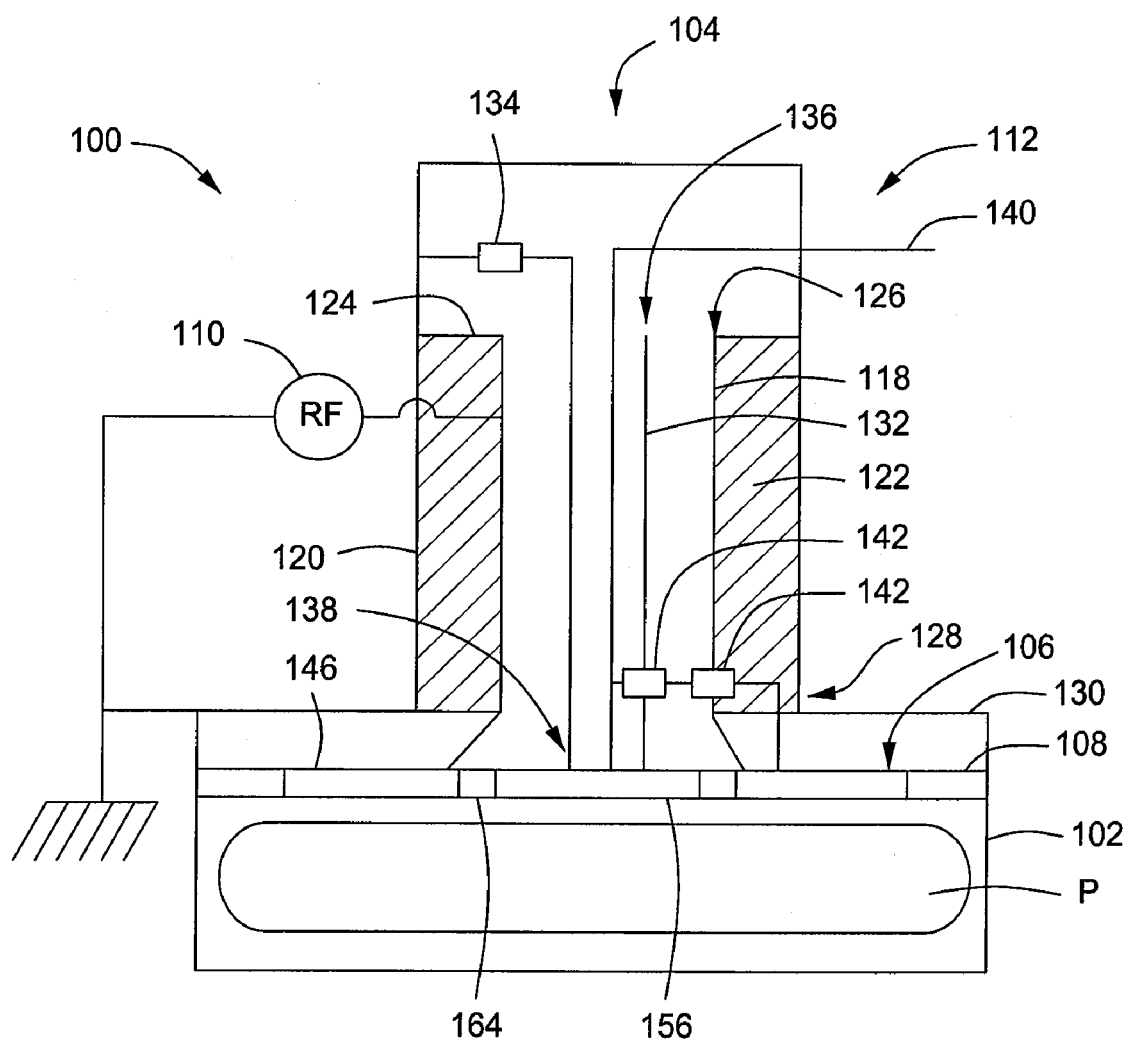
FIG. 1 is a schematic side view in cross-section of a plasma reactor having an adjustable tuning circuit in accordance with some embodiments of the present invention.

To facilitate understanding, similar (e.g., with identical digits appearing in the tens and units places) reference numerals have been used, where possible, to designate identical, or at least functionally similar, elements that are common to one or more of the figures.

DETAILED DESCRIPTION

The present invention provides methods and apparatus for controlling the RF power distribution within a process chamber. The apparatus advantageously provides an adjustable tuning circuit that facilitates tuning the uniformity of the RF power distribution within the chamber. The adjustable tuning circuit may be part of a match circuit for matching the impedance of a plasma formed within the process chamber to that of an RF source generator that provides the RF power. In some embodiments, the adjustable tuning circuit facilitates coupling RF power to a plasma discharge through a terminated resonant wave structure with an adjustable tap point to provide a low voltage standing wave ratio (VSWR) match condition to the RF generator over a large range of plasma impedance conditions. The inventive apparatus and methods uses plasma boundary condition control to facilitate control of standing wave properties of a launched RF wave, thereby controlling plasma uniformity. The plasma boundary condition control is established at a location remote from the plasma and may be accomplished, for example, by resonating an electrode at a drive frequency and terminating the electrode with a controllable impedance to manipulate the standing wave generated by the electrode, thereby facilitating control of the standing wave characteristic typically generated in a single electrode, diode type reactor.

Suitable process chambers that may benefit from the present invention include various etch, deposition, or other plasma enhanced process chambers such as the ENABLER® process chamber, available from Applied Materials, Inc., of Santa Clara, Calif., amongst others. The ENABLER® process chamber is described, in part, in U.S. Pat. No. 7,030,335, issued Apr. 8, 2006 to Hoffman, et al (hereinafter Hoffman), and entitled, "Plasma reactor with overhead RF electrode tuned to the plasma with arcing suppression," which is hereby incorporated by reference. It is contemplated that the apparatus and methods described herein may be modified and/or applied to different plasma enhanced process chambers in accordance with the teachings provided herein.

FIG. 1 illustratively depicts a schematic of a plasma reactor 100 in accordance with some embodiments of the present invention. The reactor 100 generally includes a chamber 102, having an overhead electrode 106 disposed therein, and an adjustable tuning circuit 104 for providing a tunable path for coupling RF power supplied by an RF power source, such as RF generator 110, to the electrode 106. The electrode 106 may be coupled to the chamber 102 via a dielectric seal 108. The chamber 102 may be grounded, such as by connection to the RF ground of the RF generator 110.

In some embodiments, the adjustable tuning circuit 104 may comprise a coaxial stub 112 configured to provide an enhanced level of RF power distribution within the chamber 102 above and across a semiconductor substrate (not shown) disposed therein beneath the electrode 106. In some embodiments, the coaxial stub 112 may include a first resonator and a second resonator coupled to the electrode 106. For example, as depicted in FIG. 1, a source resonator 118 may be provided for coupling RF power from the RF power source (e.g., RF generator 110) to the electrode 106, and a return path resonator 132 may be coupled to the electrode 106 for providing a return path for the RF power applied to the electrode 106 through the adjustable tuning circuit 104. The phrase "return path" as used in the term, "return path resonator" does not refer to an RF ground return path, which is separately provided (for example, through the chamber ground).

In some embodiments, the coaxial stub 112 includes a cylindrically shaped inner conductor (return path resonator 132), a substantially concentric cylindrically shaped intermediate conductor (source resonator 118), and a substantially concentric cylindrically shaped outer conductor 120. An insulator 122 (denoted by cross-hatching in FIG. 1) having, for example, a relative dielectric constant of 1, fills the space between the intermediate conductor (source resonator 118) and the outer conductor 120. The return path resonator 132, the source resonator 118, and the outer conductor 120 may be fabricated, at least in part, from any suitable material or materials for coupling RF power to the electrode 106, such as metals, metal containing materials, metal-coated materials, or the like. In some embodiments, the return path resonator 132, the source resonator 118, and the outer conductor 120 may be formed of nickel-coated aluminum.

The characteristic impedance of the source resonator 118 is determined, at least in part, by the relative dimensions of the diameters of the source resonator 118 and the outer conductor 120 and by the dielectric constant of the insulator 122. In some embodiments, the outer conductor 120 may have a diameter between about 3-12 inches, and the source resonator 118 may have a diameter between about 0.5-10 inches. For example, in one embodiment, the outer conductor 120 may have a diameter of about 4 inches, and the source resonator 118 may have a diameter of about 1.5 inches. Other diameters may be utilized for particular applications.

In some embodiments, the source resonator 118 may provide a fixed resonance. For example, the source resonator 118 may have an axial length calculated to be a certain wavelength, or fraction of a wavelength of an RF signal to be coupled to the electrode 106 via the source resonator 118, thereby establishing a resonance that generally matches, but is slightly offset from, the frequency of the RF signal provided by the RF power source. As an illustrative, non-limiting example, in some embodiments where an RF source power having a frequency of about 210 MHz is utilized, the source resonator 118 may have an axial length of about 29 inches, or calculated to be about ¼ wavelength of a frequency of about 220 MHz, in order to have a resonance in the vicinity of about 220 MHz, thereby generally matching, but being slightly offset from the 210 MHz RF source power frequency. In some embodiments, a terminating conductor 124 is provided to couple a first end 126 of the source resonator 118 to the outer conductor 120, thereby shorting the source resonator 118 at the first end 126. A second end 128 of the source resonator 118 may be coupled to the electrode 106. The outer conductor 120 may be connected to the chamber 102 (and therefrom to RF ground) via an annular conductive support 130.

The return path resonator 132 generally has a diameter that facilitates disposing the return path resonator 132 coaxially within the source resonator 118. In some embodiments, return path resonator 132 may have an outer diameter less than or equal to the inner diameter of the inner conductor of the source resonator 118. The return path resonator 132 provides a variable resonance via a termination impedance controlling mechanism (TICM) 134. In some embodiments, the TICM 134 may be disposed at or near a first end 136 of the return path resonator 132. In some embodiments, the TICM 134 couples the first end 136 of the return path resonator 132 to the source resonator 118 and/or the outer conductor 120. The characteristic impedance of the return path resonator 132 is therefore determined at least partially by the relative dimensions of the diameters of the source resonator 118 and the return path resonator 132, and at least partially by an impact, function, or effect of the TICM 134. A second end 138 of the return path resonator 132 is connected to the electrode 106 at a location disposed radially inwards of the location where the source resonator 118 is coupled to the electrode 106.

An interior space defined by the return path resonator 132 can provide a conduit for utilities such as process gases and coolant passing into the chamber 102 (e.g., facilities line 140), thereby advantageously routing the facilities lines to the process chamber 102 without crossing large electrical potential differences. Therefore, the facilities lines may be constructed of inexpensive and reliable materials, such as metal.

One or more insulated paths 142 may be provided in the source resonator 118 and/or the return path resonator 132 as desired to route any grounded metal facilities lines, such as line 140, through the source resonator 118 and/or the return path resonator 132 without any undesired electrical connection or interference between these components.

The electrode 106 generally comprises a conductive material suitable for use within the process chamber 102. The electrode 106 may be at least partially plate-shaped, planar in shape, and oriented substantially parallel to and opposite a substrate support surface (not shown) disposed in the process chamber 102. In some embodiments, the electrode 106 may comprise an inner electrode 156 and an outer electrode 146 having a dielectric material 164 disposed therebetween. The return path resonator 132 may be coupled to the inner electrode 156, and the source resonator 118 may be coupled to the outer electrode 146. Alternatively, the electrode 106 may have an annular shape with a dielectric material disposed within a central opening of the annular electrode as described with respect to FIG. 6, below.

In operation, the adjustable tuning circuit 104 facilitates control of boundary conditions of the plasma at a location remote from the plasma. For example, RF power from the RF generator 110 may be coupled to the outer electrode 146 of the electrode 106 via the source resonator 118. The return path resonator 132 may be coupled to the inner electrode 156 of the electrode 106 to provide a non-ground RF return path. The TICM 134 disposed at the end of the return path resonator 132 facilitates control of the termination impedance of the return path resonator 132 at a location remote from the plasma. Routing the RF power through the inner and outer electrodes 156, 146 facilitate generation of standing waves that form a combined standing wave that affects plasma uniformity. The control of the termination impedance of the return path resonator 132 facilitates control of the standing wave formed by the inner electrode 156, thereby controlling the profile of the combined standing wave, and thereby advantageously controlling the uniformity of the plasma.

FIGS. 2-5 depict various embodiments of the adjustable tuning circuit 104 as illustratively incorporated in plasma reactors similar to the plasma reactor 100 shown in FIG. 1. Unless otherwise stated, the examples of FIGS. 2-5 have constructions and operations that are similar or identical to those of the embodiment of FIG. 1, and to those of each other of the examples of FIGS. 2-5. The description with respect to any particular plasma reactor herein is illustrative only and not limiting of the scope of the invention.

Figure 2:
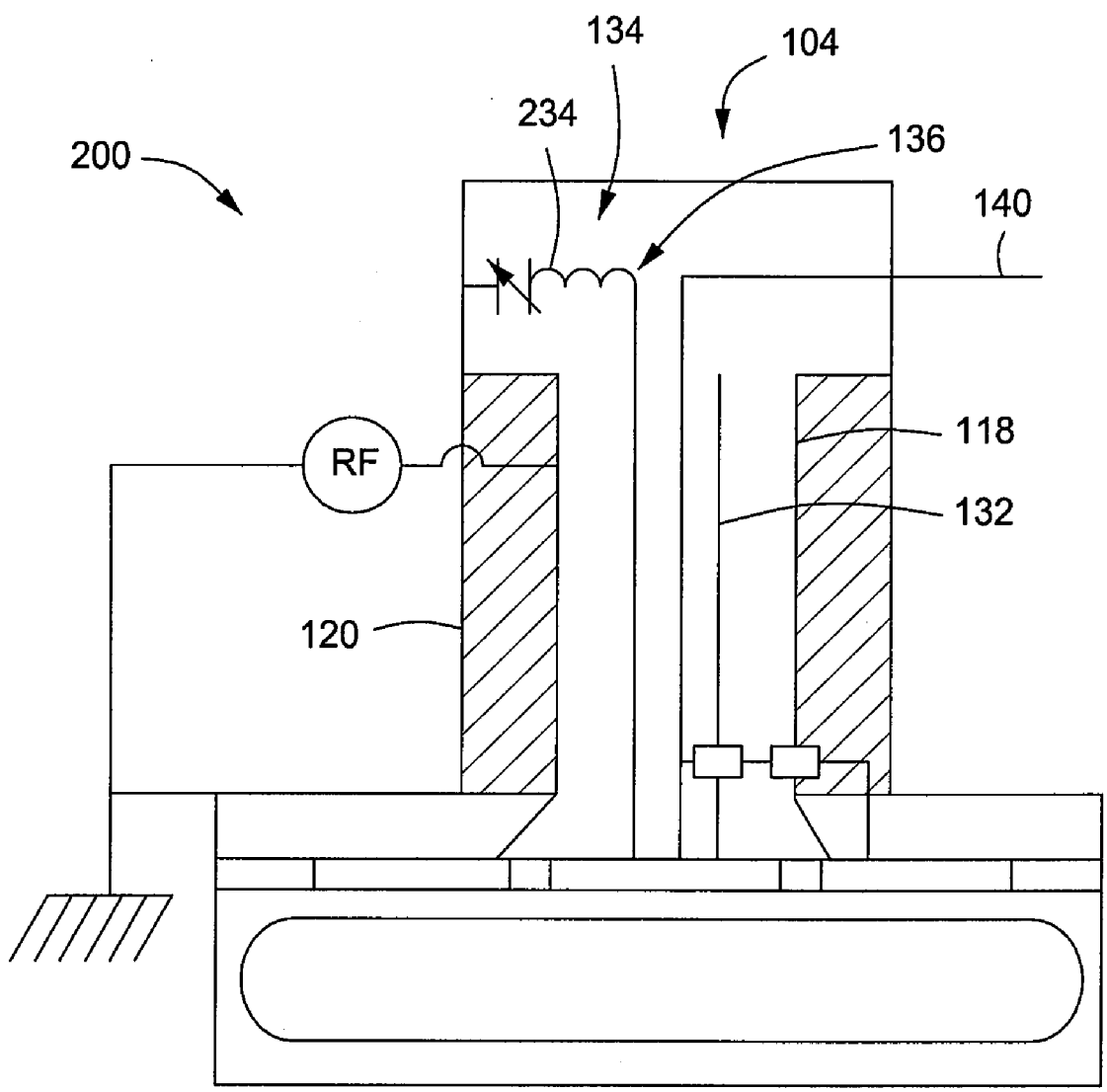
FIG. 2 is a schematic side view in cross-section of a plasma reactor having an adjustable tuning circuit in accordance with some embodiments of the present invention.

FIG. 2 depicts a plasma reactor 200, similar to the plasma reactor 100 described above, having an adjustable tuning circuit 104, or a TICM 134, in accordance with some embodiments of the present invention. As shown in FIG. 2, in some embodiments, the TICM 134 of the adjustable tuning circuit 104 may include a set of reactive elements 234 disposed between the first end 136 of the return path resonator 132 and the outer conductor 120. The reactive elements 234 may be controlled to adjust the termination impedance between the return path resonator 132 and the outer conductor 120. In some embodiments, the reactive elements 234 may include an inductor and a variable capacitor configured, for example, as an LC circuit. It is contemplated that the TICM 134 may comprise other types of impedance-controlling circuits having varying components and/or configurations.

In operation, a large level of active control over the center-of-plasma termination impedance can be provided by the reactive elements 234. For example, the inductor and variable capacitor may comprise an LC shunt that resonates at a desired frequency (for example, when a 160 MHz RF source is used, at about 162 MHz). The reactive elements 234 of the TICM 134 provide for the control of the resonance of the return path resonator 132 by control, for example, of the variable capacitor. Specifically, the termination impedance of the return path resonator 132 may be selectively defined between and including an open circuit and a short condition through operation of the variable capacitor.

Figure 3:
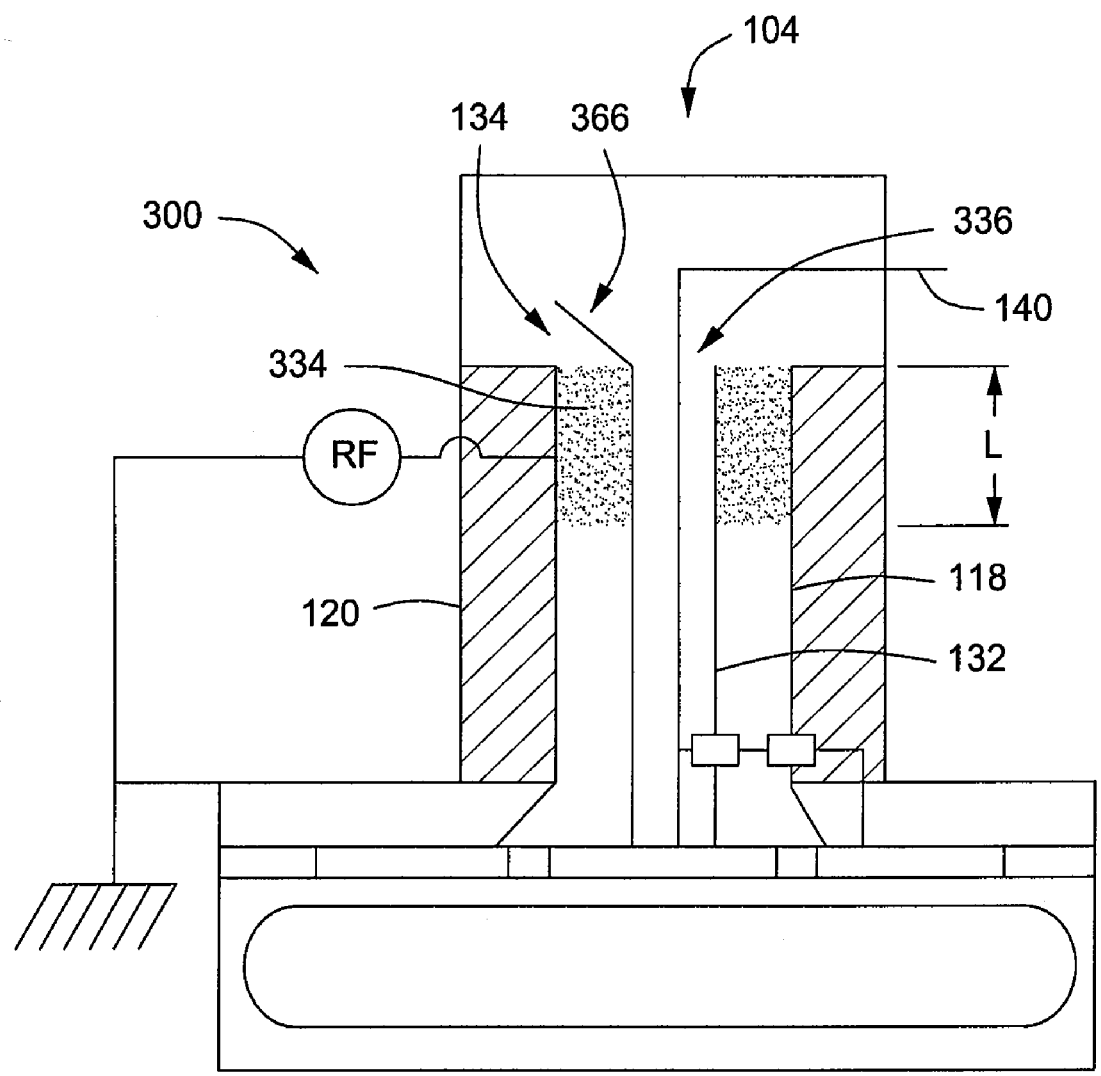
FIG. 3 is a schematic side view in cross-section of a plasma reactor having an adjustable tuning circuit in accordance with some embodiments of the present invention.

FIG. 3 depicts a plasma reactor 300, similar to the plasma reactor 100 described above, having an adjustable tuning circuit 104, or a TICM 134, in accordance with some embodiments of the present invention. As shown in FIG. 3, in some embodiments, the TICM 134 may provide for selective control of the electrical length of the RF transmission line. For example, the TICM 134 may include a dielectric element 334 disposed adjacent a first end 336 of the return path resonator 132 and within a space between the return path resonator 132 and the source resonator 118. In some examples, the dielectric element 334 may be fabricated from a suitable material, such as polytetrafluoroethylene (PTFE), Vespel®, Ultem®, Rexalite®, alumina, quartz, sapphire, or the like. The dielectric element 334 may have a dielectric constant, k, of between about 2-10. The length (L) of the dielectric element may be selected to suit a particular application, for example, to provide a desired termination impedance for the return path resonator 132.

Alternatively, the length (L) of the dielectric element 334 may be controlled, for example, by providing dielectric material in an adjustable bladder that may be selectively expanded or contracted to control the quantity of dielectric material disposed between the return path resonator 132 and the source resonator 118, or by adding or subtracting various washer-shaped rings of dielectric in series to achieve the desired length, or the like.

The dielectric constant of the dielectric element 334 may be controlled, for example, by controlling the pressure in the space between the return path resonator 132 and the source resonator 118, use of a dielectric material having directional properties (e.g., that may be switched between different particle orientations associated with different dielectric strengths via electric field switching means, optical switching means, or the like), or the like.

In operation, selective control of the length of the dielectric element 334 controls the effective electrical length of the RF transmission line provided by the return path resonator 132 and the source resonator 118. For example, increasing either or both of the length of the dielectric element 334 or the dielectric constant, k, of the dielectric element 334 increases the electrical length over which the termination impedance is transformed, thereby presenting the RF circuit with a different impedance at the plasma interface. For example, a short in the end of a ¼ wavelength transmission line will present an open to the plasma. Increasing the electrical length by a factor of 2, or increasing the dielectric constant by a factor of 4 will revert the impedance seen by the plasma back to a short. Decreasing either or both of the length of the dielectric element 334 or the dielectric constant, k, of the dielectric element 334 decreases the electrical length over which the termination impedance is transformed, thereby presenting the RF circuit with a different impedance at the plasma interface.

Alternatively or in combination, in some embodiments, the TICM 134 may include a switch 366 that selectively couples a first end 336 of the return path resonator 132 to ground, for example, via an end of the source resonator 118 that is coupled to ground via the outer conductor 120. The switch 366 may be selectively toggled between a closed position, in which the return path resonator 132 is coupled to ground, thereby shorting the return path resonator 132, and an open position, in which the return path resonator 132 is substantially electrically isolated from other components (such as the source resonator 118 or the outer conductor 120) to provide an open circuit at the first end 336 of the return path resonator 132.

In operation, the switch 366 enables the return path resonator 316 to be selectively operated between two resonant modes. For example, in some embodiments, the return path resonator 316 may be configured to resonate either at a quarter wave or as a half wave with respect to the frequency provided by the RF generator 110, depending on the opened/closed state of the switch 366. Specifically, the switch 366 may facilitate operating the adjustable tuning circuit 104 of the plasma reactor 300 in an open state, to set up a high voltage condition, or in a closed state, to set up a high current condition—either of which effectively shifts the boundary condition of the related standing wave by a factor of a quarter wave. In experimental modes, for example, such a capability would enable an operator to obtain twice as many data points than may otherwise be the case (e.g., one can only shift an electrical length so much by filling the gap between the inner and outer conductors 332, 318 of the return path resonator with various lengths of dielectric material).

During high voltage condition states of operation, for example, when the switch 366 is open, large electrical potential differences may arise between the source resonator 118 and the return path resonator 132. Accordingly, in such embodiments, the facilities line 140, may become RF hot if fabricated from a conductive material (such as metal) and would have to be ameliorated, for example, by using non-conductive facilities lines or by otherwise insulating the facilities lines from RF power.

Figure 4:
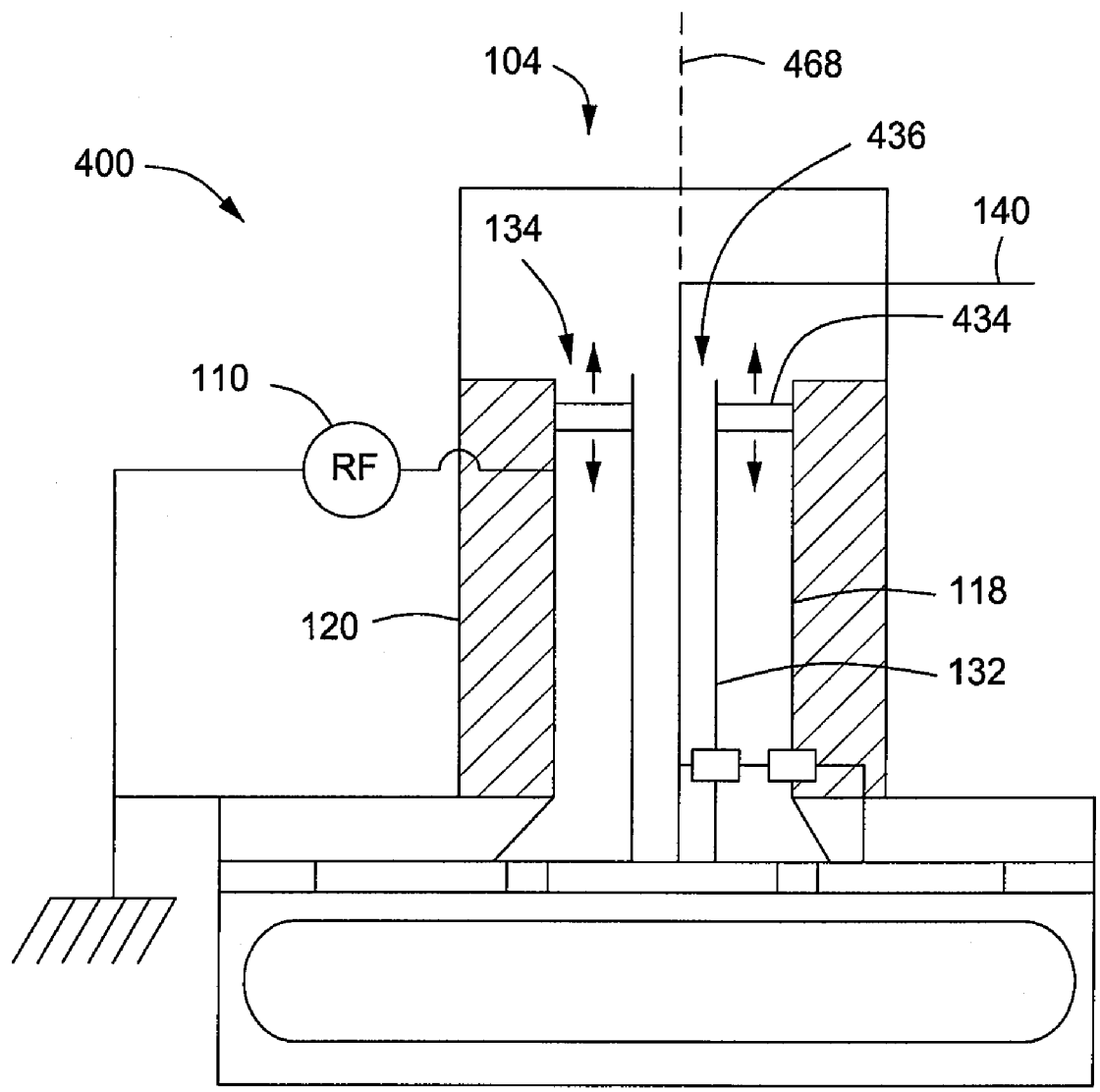
FIG. 4 is a schematic side view in cross-section of a plasma reactor having an adjustable tuning circuit in accordance with some embodiments of the present invention.

FIG. 4 depicts a plasma reactor 400, similar to the plasma reactor 100 described above, having an adjustable tuning circuit 104, or a TICM 134, in accordance with some embodiments of the present invention. As shown in FIG. 4, in some embodiments, the TICM 134 may provide for selective control of the physical length of the RF transmission line. For example, the TICM 134 may include a ground stub 434 movably disposed adjacent a first end 436 of the return path resonator 132 in a space or gap between the source resonator 118 and the return path resonator 132. The ground stub 434 provides a common ground connection (for example, via connection to the outer conductor 120, directly to ground, or through some other grounded component) to each of the source resonator 118 and the return path resonator 132. The ground stub 434 is adapted to slide along a longitudinal axis of extension 468 common to the source resonator 118 and the return path resonator 132.

In operation, the position of the ground stub 434 may be controlled manually or automatically, for example, via an actuator (not shown) in order to provide a desired length of the source resonator 118 and the return path resonator 132 between the electrode 106 and the ground stub 434 (for example, to facilitate selective adjustment and control of the physical length of the RF transmission line provided by each of the source resonator 118 and the return path resonator 132). The length of the source resonator 118 and the return path resonator 132 may be controlled as desired via the movable ground stub 434, for example, prior to setting up the chamber in accordance with a particular process recipe, between runs to fine tune control of a process, for testing purposes, or the like.

Figure 5:
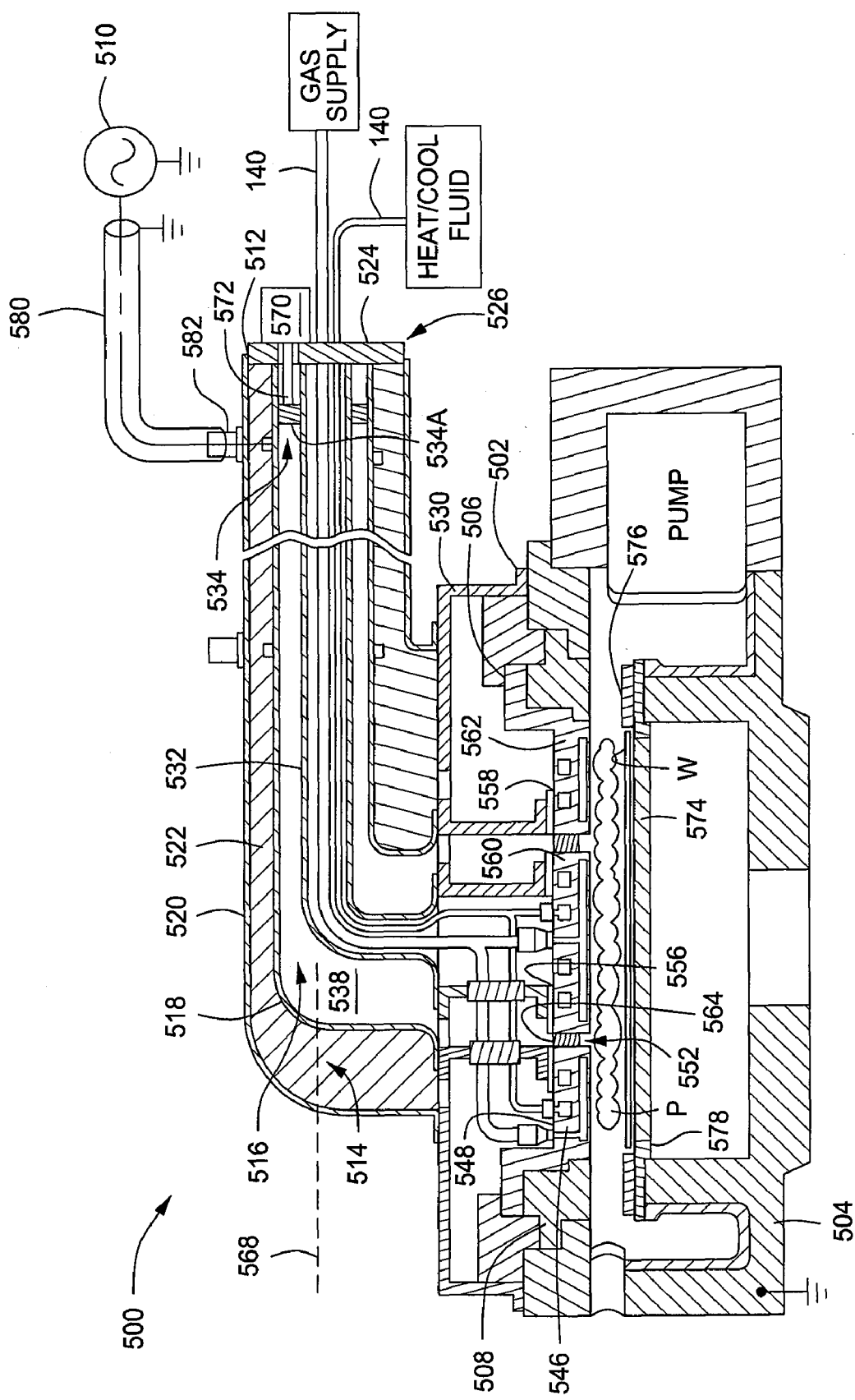
FIG. 5 is a schematic side view in cross-section of a plasma reactor having an adjustable tuning circuit in accordance with some embodiments of the present invention.

FIG. 5 illustratively depicts a plasma reactor 500 that is structurally and/or functionally identical or similar to the exemplary plasma reactors illustrated in, for example, FIGS. 1-4, and having further detail illustrated to provide further example of embodiments of the present invention. Similar reference numerals and/or descriptors (for example, reactor 500 or return path resonator 532 as respectively compared to reactor 100 or return path resonator 132) may be used to denote elements that are similar or identical to previously described elements having the similar descriptor and/or reference numeral.

The plasma reactor 500 depicted in FIG. 5 includes a coaxial stub 512 coupled thereto via a conductive support 530. The coaxial stub 512 includes an outer conductor 520, a source resonator 518, a return path resonator 532, and a TICM 534 having a ground stub 534a and an actuator 570 (e.g., mounted to a terminating conductor 524) for permitting a user to selectably adjust a position of the ground stub 534a along a longitudinal axis 568 common to the source resonator 518 and the return path resonator 532. The actuator 570 includes an arm 572 that extends through the terminating conductor 524 and is attached to the ground stub 534a for purposes of selectively controlling the position of the ground stub 534a along the axis 568.

The plasma reactor 500 further includes a substrate support 574 at the bottom of a chamber 502 for supporting a semiconductor substrate W. A semiconductor ring 576 is supported on a grounded chamber body 504 by a dielectric (quartz) ring 578. RF power from an RF generator 510 is coupled to an electrode 506 through a coaxial cable 580 matched to the generator 510 and into the coaxial stub 512 via a tap 582 formed therein. An RF path from the overhead electrode 506 to RF ground via the chamber body 504 is affected by, among other conditions, the capacitance of the semiconductor ring 576, the dielectric ring 578, and a dielectric seal 508. The substrate support 574, the substrate W, and the semiconductor ring 576 are included in this return path for RF power applied to the electrode 506.

In operation, the coaxial stub 512 is operable to resonate the electrode 506 in a manner that promotes increased uniformity in the distribution of RF power in the plasma cloud beneath the electrode 506 and vertically above the substrate W disposed in the chamber 502. More particularly, the source resonator 514 of the coaxial stub 512 is operable to resonate a second conductor segment 562 of the electrode 506 so as to generate an RF standing wave at the drive frequency of the original RF power source (e.g., RF generator 510), and launch the same into the chamber 502 and into a cloud of plasma P contained therein. The return path resonator 532 is in turn operable to utilize some of the RF power contained within and transmitted through the cloud of plasma P that passes back through the electrode 506, to resonate a first conductor segment 560 of the electrode 506 so as to generate another standing wave at the drive frequency of the original RF power source. The second conductor segment 562 can accordingly be described as a primary electrode to which is paired, e.g., in the form of the first conductor segment 560, a counterelectrode.

The first and second conductor segments 560, 562 of the electrode 506 are adapted to be used and to resonate (e.g., as described herein) at least in part because respective first and second attachment locations 556, 558 on the electrode 506 are sufficiently radially or laterally spaced apart so as to provide at least some degree of functional independence from each other from an RF power transmission perspective. Further in this example, as in the examples of FIGS. 1-4, the first and second attachment locations 556, 558 are separated not only by lateral or radial distance along the electrode 506, but also by a segmentation or material break in the electrode 506 brought about by the presence of an aperture 552. This further contributes to such RF power transmission independence.

Also in this example, as in the examples of FIGS. 1-4, the first and second attachment locations 556, 558 are fully and completely separated by a dielectric element 564, which at least partially restricts lateral or radial transmission of RF power between adjacent segments of the electrode 506. As will be discussed in further detail hereinafter, it is not strictly necessary that any one or more than one of the three conditions discussed immediately hereinabove to exist for the source and return path resonators 518, 532 to be operable to interact in concert with the electrode 506 to generate respective standing waves for propagation within the chamber 502. Nevertheless the simultaneous presence of these three conditions in the embodiment shown in FIG. 5 is at least sufficient to permit such operation and functional interaction as between the source and return path resonators 518, 532 of the coaxial stub 512 and the electrode 506.

As shown in FIG. 5, the axial lengths of the source and return path resonators 518, 532 of the coaxial stub 512 are similar. As such, all other related aspects or factors being equal, the source and return path resonators 518, 532 would ordinarily have similar electrical lengths. They could also possibly provide the electrode 506 with respective termination impedances having similar values or magnitudes. Factors that might tend to cause either or both of the respective electrical lengths and the respective termination impedances of the source and return path resonators 518, 532 to diverge from each other could include the presence of the light dielectric 522 along the entire length of the source resonator 518, differing ratios as between the diameters of the respective inner and outer conductors, the presence and/or operation of the TICM 534 at the first end 526 of the return path resonator 516, etc.

To the extent such divergence or divergences as described immediately hereinabove do exist, they may provide advantages, e.g., in processing flexibility, depending on the particular application. The TICM 534, for example, permits a user to control, fine tune, and/or otherwise modify a termination impedance provided by the return path resonator 532 to the electrode 506 at the first conductor segment 560, thereby permitting the user to experiment with and/or modify the properties of a secondary standing wave generated by the electrode 506 at the first conductor segment 560, as well as the properties of the combined standing wave generated by the electrode 506 created as a result of the respective standing waves produced by the electrode 506 at the first and second conductor segments 560, 562). As a result, the user is permitted to explore the effects such adjustments could have on the degree or level of RF power spatial distribution within the chamber 502. Where a particular shape or form of the combined standing wave generated by the electrode 506 proves to be beneficial in this regard, a corresponding setting of the TICM 534 can be hard wired for perpetual use, and/or recorded for future use (e.g., for immediate use, as in when such a setting is arrived at as part of a calibration step followed immediately by an associated processing step) as part of particular operation modes of operation of the plasma reactor 500. In any event, the dual resonation functionality of the coaxial stub 512 is capable of supplying manufacturers of semiconductor devices with considerable flexibility and tuneability for supporting efforts to refine and improve semiconductor device fabrication techniques involving plasma generation and manipulation.

The plasma reactor 500 uses the return path resonator 532 embedded within the coaxial stub 512 as part of a top frequency tuning circuit similar to that which is described in the previously incorporated U.S. Pat. No. 7,030,335 to Hoffman, et al. For example, RF power is coupled to a plasma discharge through a terminated source resonator with an optimized tap point so as to provide a low VSWR match condition to the RF generator for a large range of plasma impedance conditions. The plasma reactor 500 differs from that which is described in Hoffman at least in that the electrode 506 is also coupled by a return path resonator 532 (e.g., via a primary electrode/counterelectrode arrangement). The return path resonator 532 can have user-defined impedance, e.g., controllable via the TICM 534, so as to at least partially define the boundary conditions of a standing wave formed by the electrode 506. In at least some embodiments, the return path resonator 532 provides a user-definable center-of-plasma termination impedance that does not substantially impact the tuning capability of the entire circuit. For example, the return path resonator 516 in some such embodiments can change the center-of-plasma termination impedance while still providing something close to, e.g., a 50 Ohm load for the generator 510, so as to maximize delivered RF power to the chamber 502.

Figure 6:
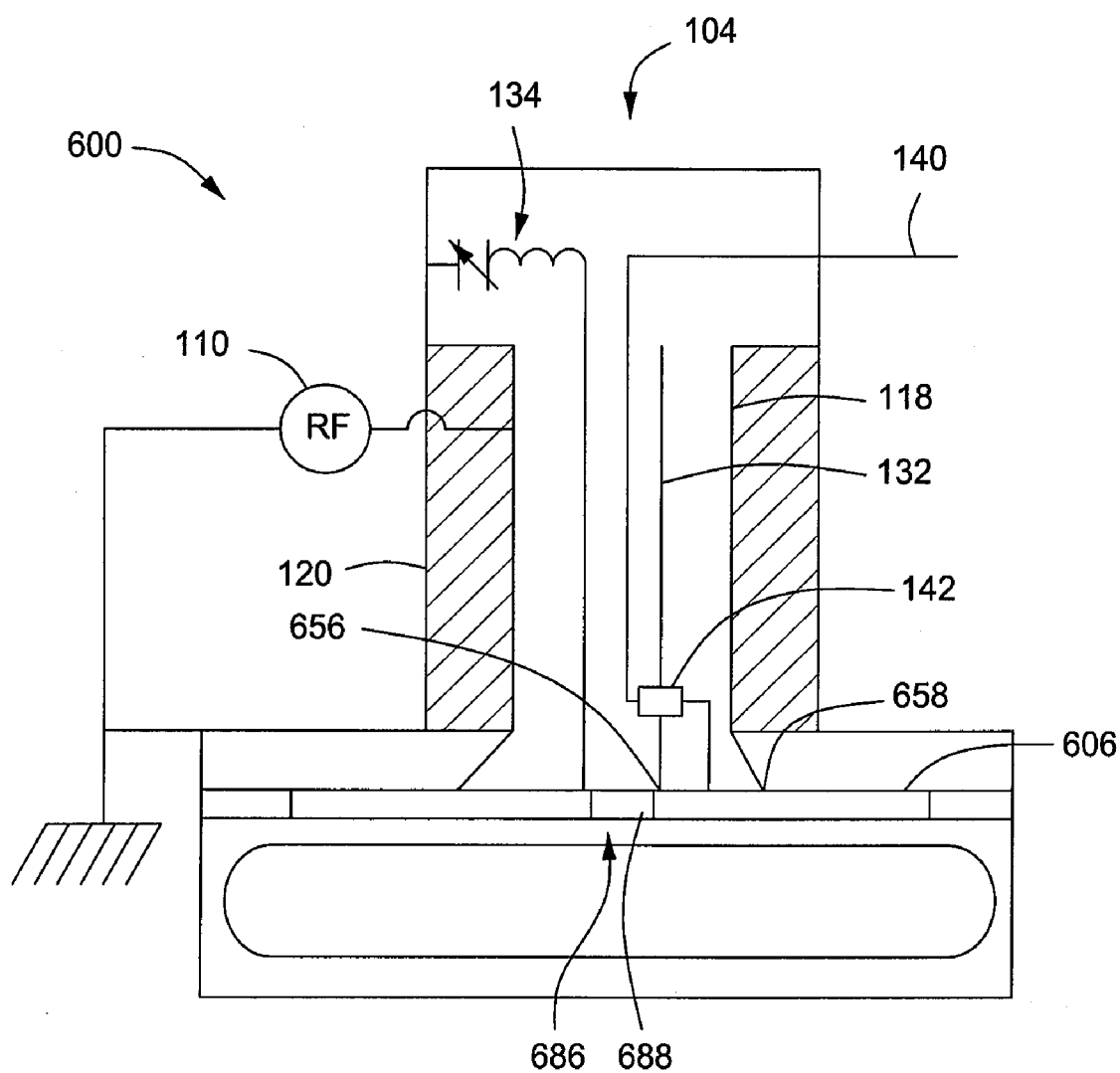
FIG. 6 is a schematic side view in cross-section of a plasma reactor having an adjustable tuning circuit in accordance with some embodiments of the present invention.

FIG. 6 depicts a plasma reactor 600 suitable for use with an adjustable tuning circuit 104 or TICM 134, for example as described above with respect to FIGS. 1-5, in accordance with embodiments of the present invention. The plasma reactor 600 is generally similar to the plasma reactors described above with respect to FIGS. 1-5 except as provided below. In some embodiments, the plasma reactor 600 includes a unitary electrode 606 (as compared to the segmented electrode 106 described above). The electrode 606 may be annular in shape and may include a centrally disposed opening 686 having a dielectric element 688 disposed therein.

The source resonator 118 and return path resonators 132 are coupled to the electrode 606 at laterally disposed locations. For example, the source resonator 118 may be coupled to the electrode 606 at a first location 658 and the return path resonators may be coupled to the electrode 606 at a second location 656 that is disposed radially inwards of the first location 658. In some embodiments, the second location 656 may be proximate an inner edge of the electrode 606 (e.g., proximate the opening 686). The first location 658 may be disposed radially outwards of the second location at any point along the electrode 606 up to and including proximate an outer edge of the electrode 606.

As the electrode 606 is unitary, a single break 142 may be provided in the return path resonator 132 to permit passage of facilities lines (such as facilities line 140) to the electrode 606 through the central passageway defined by the return path resonator 132.

In operation, the plasma reactor 600 does not include a separate RF ground reference that facilitates creation of a second standing wave, but the geometry of the electrode 606 facilitates generation of a single standing wave having a profile that is controlled by the termination point of the return path resonator 132 (e.g., as controlled by the TICM 134).

Figure 7:
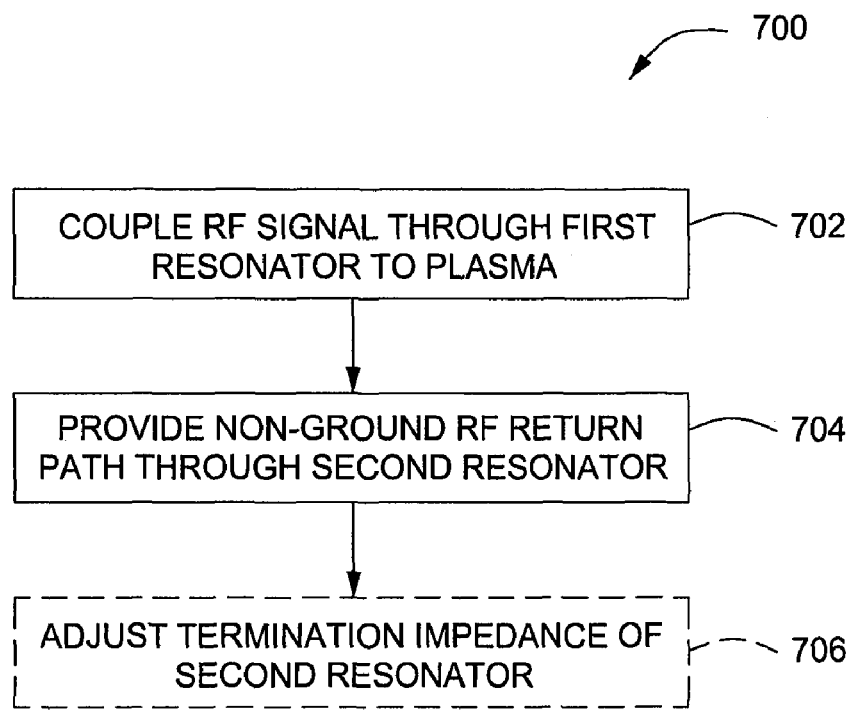
FIG. 7 is a flow diagram of a method of operating embodiments of plasma reactors as described herein.

FIG. 7 depicts a flow diagram of one embodiment of a method 700 for providing and/or controlling characteristics (such as uniformity) of a plasma in a process chamber. The method 700 may be stored in computer readable form in the memory of a controller coupled to the process chamber, or in other storage medium. Although the method 700 is described below with reference to a plasma reactor, the method 700 may also be used in other plasma applications involving plasma generation.

The method 700 begins at 702, where an RF signal is coupled to a plasma through a first resonator. For example, an RF signal having a desired frequency and power may be provided by the RF generator 100 to the electrode 106 via the source resonator 118. The RF signal causes the electrode to generate and launch an RF wave into the chamber, thereby coupling the RF signal to the plasma. In some embodiments, the RF source power may be utilized to form a plasma within the chamber. Alternatively, the plasma may be formed via a different source of RF power and the RF power provided to the electrode via the source resonator may be utilized to at least partially control characteristics of the plasma.

Next, at 704, a non-ground RF return path is provided through a second resonator. For example, the return path resonator 132 coupled to the electrode 106 provides a non-ground RF return path for RF power within the plasma. The second resonator (for example, the return path resonator 132) facilitates controlling the plasma boundary conditions at a location remote from the plasma, thereby facilitating control of standing waves within the plasma that affect plasma uniformity.

Optionally, at 706, the termination impedance of the second resonator may be adjusted. Adjusting the termination impedance of the second resonator facilitates control of the plasma boundary conditions as discussed above. For example, the termination impedance of the return path resonator 132 can be controlled via adjusting the TICM 134. The generation and control of plasma characteristics, such as plasma uniformity generally continues as desired, for example during processing of a semiconductor substrate. Upon completion of 704, or optionally 706, the method 700 ends.

It is contemplated that various specific mechanisms of the adjustable switch and/or termination impedance control mechanism, and the usage thereof as described above, may be combined, switched, and/or modified in accordance with the teachings provided herein. In addition, the exemplary plasma reactors and methods described herein may be utilized with a multifrequency RF feed. In such embodiments, the return path resonator impacts the termination impedance of all frequencies being provided. Thus, the return path resonator would need to be designed, and/or the frequencies would need to be selected, so as to facilitate the desired effect of the return path resonator. For example, to launch both 60 MHz and 120 MHz RF signals, then a return path resonator could be utilized that is a quarter wave resonator with respect to the 60 MHz wave and a half wave resonator with respect to the 120 MHz wave.

In some embodiments, the exemplary plasma reactors and methods described herein may further include sensors (not separately shown) placed on one or more of the source resonator, the return path resonator, the electrode, the counter-electrode, or the like, to control RF power distribution within the chamber. Such sensors may allow a user to actively control the adjustable tuning circuit. For example, adjustable tuning circuit may be actively controlled based upon RF measurements on one or more of the surfaces described above. In some embodiments, RF measurements, for example, in the form of waveform magnitude and phase, can be taken and compared to what may correspond to predetermined desired readings, and the adjustable tuning circuit may be adjusted or changed as desired to until the measurements approach the desired readings. Thus, a user may measure RF readings as described above and control or fine tune the adjustable tuning circuit in real time based on measurements taken during an actual plasma generation application.

Although the prevailing view is that most conventional RF circuits for generating and maintaining plasma terminate at an open circuit at the center-of-plasma, the present inventors have discovered that such systems may be treated as if they terminate to the impedance of all elements associated with the RF electrode and matching circuit. Specifically, the termination point may be more closely viewed as the impedance of the entire drive circuit (for example, the matching network, the generator, the electrode, and the like) as seen at the center of the plasma. This may be the true center-of-plasma termination impedance because the plasma may be considered a part of a transmission line that provides a path for the electromagnetic wave to propagate all the way back up through the source resonator and beyond, to and including the RF source generator. The plasma reactors and match circuits described herein advantageously provide apparatus that beneficially and advantageously facilitates control of the termination impedance that the delivery system 'sees' at the center of the plasma. In so doing, RF source power is focused back into the plasma by means of a second standing wave, and a fine-tuning adjustment mechanism is provided, thereby allowing, for example, more uniform (for example, edge-to-edge or center-to-edge) RF power distribution within the plasma reactor, as well as better processing results attributable to such improved uniformity RF power distribution.

Thus, methods and apparatus for controlling the spatial distribution of RF power, and thereby improving plasma uniformity in an associated processing chamber, have been provided.

While the foregoing is directed to embodiments of the present invention, other and further embodiments of the invention may be devised without departing from the basic scope thereof, and the scope thereof is determined by the claims that follow.

The invention claimed is:

1. A resonator for use in conjunction with a plasma reactor, comprising:
   a source resonator for receiving an RF signal having a first frequency;
   a return path resonator disposed substantially coaxially with, and at least partially within, the source resonator; and
   an outer conductor having the source resonator and the return path resonator disposed substantially coaxially with, and at least partially within, the outer conductor, the outer conductor for providing an RF ground connection.

2. The resonator of claim 1, wherein the source resonator is dimensioned to resonate at a frequency at or near the first frequency, and wherein the return path resonator is tunable to resonate at varying frequencies.

3. The resonator of claim 2, wherein the return path resonator provides a controllable termination impedance.

4. The resonator of claim 1, further comprising:
   a set of tunable reactive elements coupled between the return path resonator and the outer conductor.

5. The resonator of claim 4, wherein the set of tunable reactive elements comprise:
   an inductor; and
   a variable capacitor.

6. The resonator of claim 1, further comprising:
   a ground stub electrically coupled to the source resonator and the return path resonator and axially movably disposed therebetween.

7. The resonator of claim 6, further comprising:
   an actuator coupled to the ground stub to selectively control the axial position of the ground stub relative to the source resonator and the return path resonator.

8. The resonator of claim 1, further comprising:
   a dielectric material disposed between the source resonator and the return path resonator.

9. The resonator of claim 1, further comprising:
   a switch selectively coupling an end of the return path resonator to the outer conductor.

10. An apparatus for controlling characteristics of a plasma formed in a plasma reactor, comprising:
- a plasma processing chamber having an electrode disposed therein;
- an RF generator; and
- an adjustable tuning circuit coupling the RF generator to the electrode, the adjustable tuning circuit comprising:
  - a source resonator coupled between the electrode and the RF generator and dimensioned to resonate at a frequency at or near a drive frequency provided by the RF generator;
  - a return path resonator coupled to the electrode in a radially spaced-apart relation with respect to the source resonator; and
  - an outer conductor coupled to an RF ground.

11. The apparatus of claim 10, wherein the return path resonator is tunable to resonate at varying frequencies.

12. The apparatus of claim 10, wherein the return path resonator provides a controllable termination impedance.

13. The apparatus of claim 10, wherein the source resonator comprises a hollow, cylindrical first conductor arranged substantially coaxially within the outer conductor, and wherein the return path resonator comprises a hollow, cylindrical second conductor arranged substantially coaxially within the first conductor.

14. The apparatus of claim 10, further comprising:
- a set of tunable reactive elements coupled between the return path resonator and the RF ground.

15. The apparatus of claim 14, wherein the set of tunable reactive elements comprise:
- an inductor; and
- a variable capacitor.

16. The apparatus of claim 10, further comprising:
- a ground stub electrically coupled to the source resonator and the return path resonator and axially movably disposed therebetween.

17. The apparatus of claim 16, further comprising:
- an actuator coupled to the ground stub to selectively control the axial position of the ground stub relative to the source resonator and the return path resonator.

18. The apparatus of claim 10, further comprising:
- a dielectric material disposed between the source resonator and the return path resonator.

19. The resonator of claim 10, further comprising:
- a switch selectively coupling an end of the return path resonator opposite the electrode to the outer conductor.

20. The apparatus of claim 10, further comprising:
- a sensor disposed on a surface of the electrode; and
- a controller coupled to the adjustable tuning circuit and the sensor, the controller configured to facilitate control of the adjustable tuning circuit in response to data provided by the sensor.

21. The apparatus of claim 10, wherein the electrode comprises:
- a planar conductor having a substantially centrally disposed aperture formed therethrough; and
- a dielectric disposed within the aperture;
- wherein the return path resonator is coupled to the conductor at a first location on the conductor adjacent to the aperture and wherein the source resonator is coupled to the electrode at a second location disposed radially outwards of the first location.

22. The apparatus of claim 10, wherein the electrode comprises:
- a first planar conductor having a substantially centrally disposed aperture formed therethrough;
- a second planar conductor disposed within the aperture in a spaced-apart relation with the first conductor, thereby defining a gap therebetween; and
- a dielectric filling the gap;
- wherein the source resonator is coupled to the first conductor and wherein the return path resonator is coupled to the second conductor.

23. The apparatus of claim 10, wherein the electrode is an overhead electrode disposed proximate an upper surface of the chamber.

24. A method of controlling characteristics of a plasma, comprising:
- coupling an RF signal to the plasma through a first resonator; and
- providing a non-ground RF return path through a second resonator.

25. The method of claim 24, wherein the first resonator resonates at a frequency at or near the frequency of the RF signal.

26. The method of claim 24, further comprising:
- adjusting the termination impedance of the second resonator.

27. The method of claim 26, wherein adjusting the termination impedance further comprises:
- controlling a set of reactive elements coupled between the second resonator and RF ground.

28. The method of claim 26, wherein adjusting the termination impedance further comprises:
- controlling the position of an axially movable ground stub coupled between the second resonator and the first resonator.

29. The method of claim 26, wherein adjusting the termination impedance further comprises:
- controlling at least one of the length or the dielectric constant of a dielectric material disposed between the second resonator and the first resonator.

30. The method of claim 26, wherein adjusting the termination impedance further comprises:
- measuring an electrical condition on a surface of the electrode; and
- adjusting the termination impedance of the second resonator in response to the measured electrical condition.

31. The method of claim 24, wherein the first resonator is coupled to a first conductor of a multi-conductor electrode and wherein the second resonator is coupled to a second electrode of the multi-conductor electrode.

32. The method of claim 24, wherein the second resonator is coupled to an inner portion of an annular electrode and wherein the first resonator is coupled to the annular electrode at a location disposed radially outwards of the second resonator.

33. The method of claim 24, wherein a standing wave associated with each of the first resonator and the second resonator is generated within the plasma and wherein a resultant combined standing wave is formed that facilitates a more uniform RF power distribution within the plasma.

* * * * *